United States Patent [19]

Brewer et al.

[11] Patent Number: 5,018,164
[45] Date of Patent: May 21, 1991

[54] EXCIMER LASER ABLATION METHOD AND APPARATUS FOR MICROCIRCUIT FABRICATION

[75] Inventors: Peter D. Brewer, Newbury Park; Jennifer J. Zinck, Calabasas, both of Calif.

[73] Assignee: Hughes Aircraft Company, Los Angeles, Calif.

[21] Appl. No.: 405,940

[22] Filed: Sep. 12, 1989

[51] Int. Cl.$^5$ .............................................. H01S 3/00
[52] U.S. Cl. .................................... 372/109; 372/57; 372/66; 372/103
[58] Field of Search ..................... 372/57, 103, 109, 69

[56] References Cited

PUBLICATIONS

Brannon "Excimer Laser Etching of Polymide"; Appl. Physics 58(5), Sep. 1985 pp. 2036-2043.
Azema et al., "Assisted ArF Excimer Photo-Etching of Mercury Cadmium Telluride (MCT) Semiconductor"; SPIE, vol. 98; Excimer Beam Applications—pp. 72-75, 1988.
"Etching of Cadmium Telluride" by P. Gaugash et al., Journal Electrochem. Soc. Solid-State Science and Technology, vol. 128; No. 4, Apr. 1981, pp. 924-926.
"Excimer Laser Etching of Polymide" by J. Brannon, Journal of Applied Physics, 58(5), Sep. 1985, pp. 2036-2043.

*Primary Examiner*—Léon Scott, Jr.
*Attorney, Agent, or Firm*—Wanda K. Lenson-Low; Paul M. Coble

[57] ABSTRACT

A pulsed beam from an excimer laser is used for precision ablation of cadmium telluride (CdTe) and other materials to fabricate and delineate devices in electronic microcircuit structures. The fluence of the beam may be adjusted to selectively remove one constituent of the material, such as cadmium vs. tellurium, at a higher rate than the other constituent, while maintaining the integrity of the material surface. The beam may selectively remove an epitaxial layer of CdTe, CdZnTe, or HgCdTe from a GaAs substrate. The beam may be directed through a projection mask and optical system onto a material to form an image for patterned ablation. The optical system may focus an image of the mask on the material to form vertical sidewall patterns, or slightly defocus the image to form curved sidewall patterns and/or concave and convex lens structures for optical arrays.

27 Claims, 5 Drawing Sheets

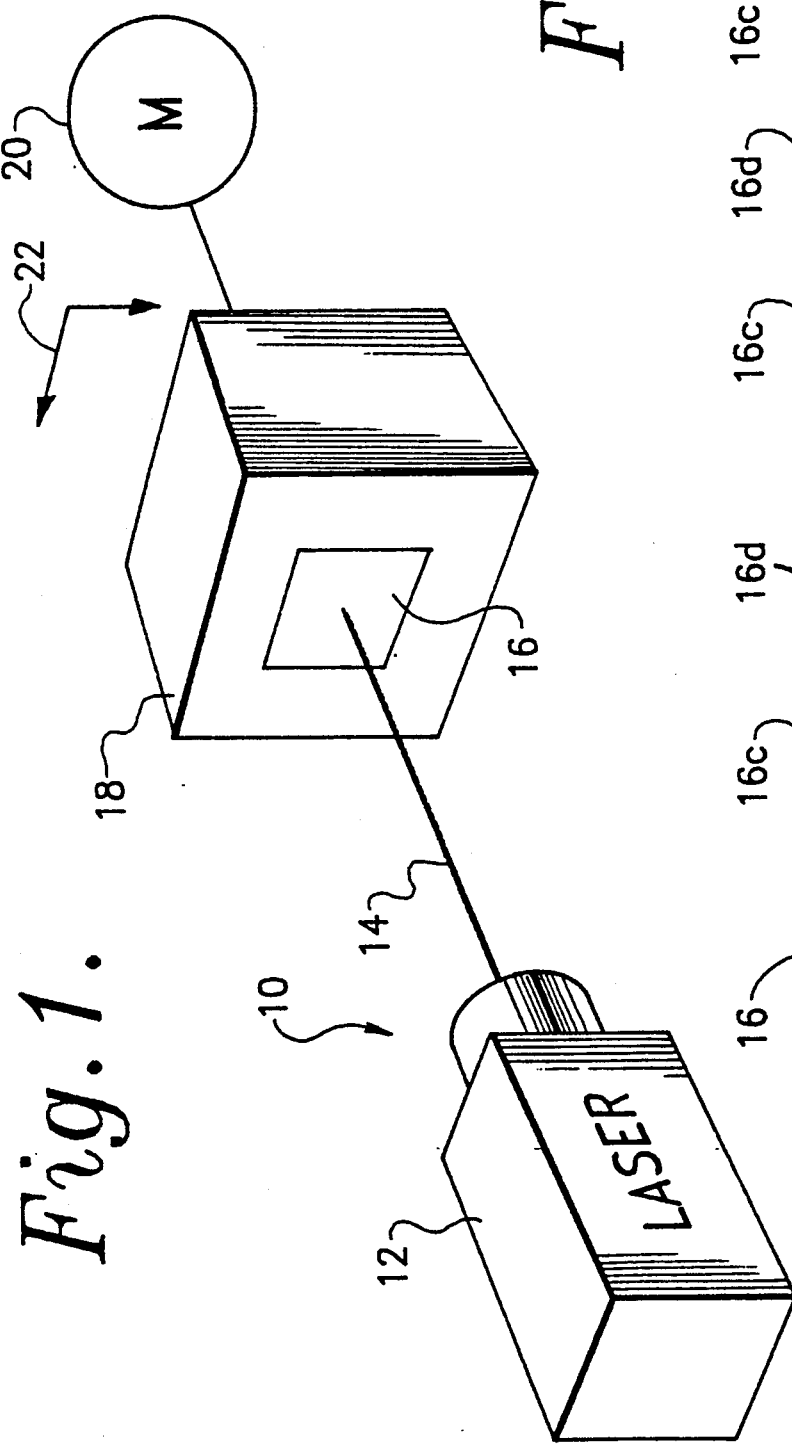
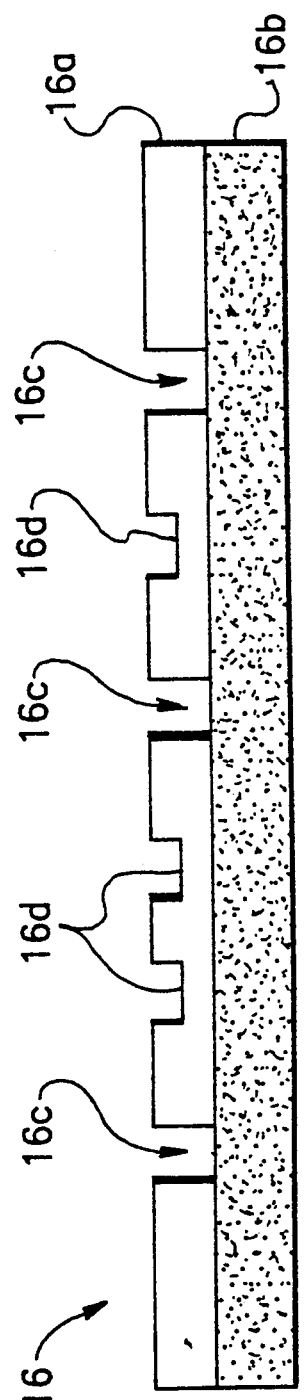

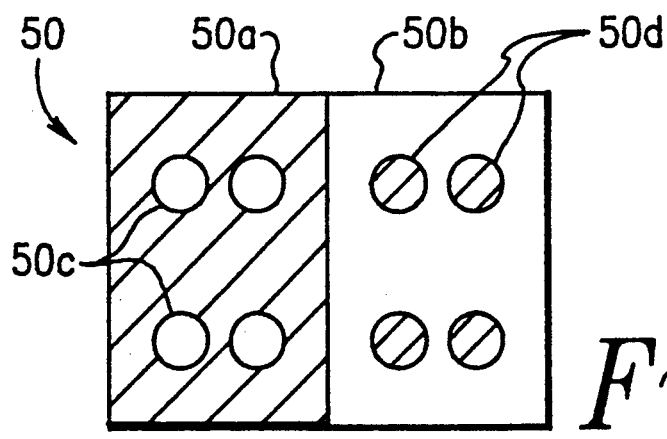
*Fig. 9.a.*
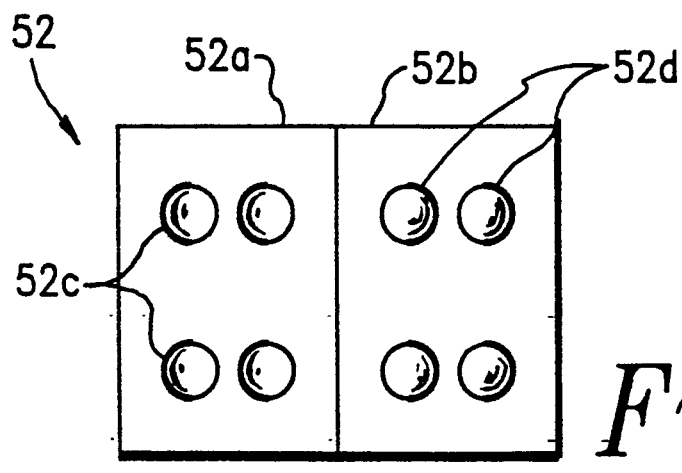
*Fig. 9.b.*
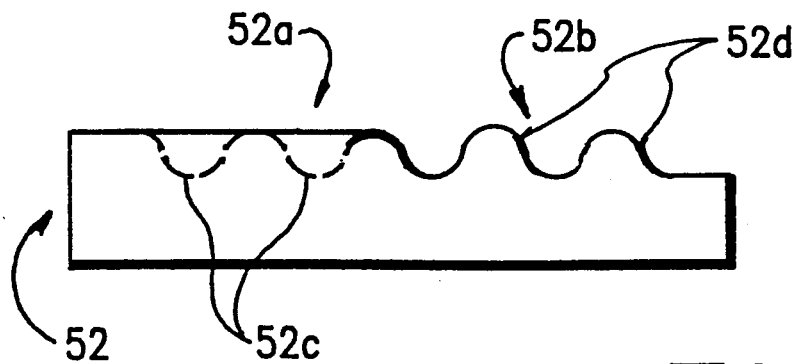
*Fig. 9.c.*

EXCIMER LASER ABLATION METHOD AND APPARATUS FOR MICROCIRCUIT FABRICATION

BACKGROUND OF THE INVENTION

1. Field of the Invention

The present invention generally relates to excimer laser ablation of materials, and more specifically to a method and apparatus which uses excimer laser ablation to form devices and delineate patterns for electronic microcircuit fabrication and the like.

2. Description of the Related Art

Device structures and patterns such as mesas and microlenses are conventionally formed at the surfaces of semiconductor materials such as cadmium telluride (CdTe) by photolithography in combination with wet chemical etching. A typical solution used to perform such etching is bromine-/ethylene glycol. A number of alternative etching solutions are discussed in a paper entitled "Etching of Cadmium Telluride", by P. Gaugash et al, J. Electrochem. Soc., SOLID-STATE SCIENCE AND TECHNOLOGY, vol. 128, no. 4, (April 1981), pp. 924–926.

The disadvantages of wet chemical etching for semiconductor processing include the generation of large quantities of toxic wastes. Other problems include surface contamination by solvent impurities, and the lack of process control leading to, for example, undercutting of etched surfaces, unwanted changes in surface composition, and crystallographic dependence on etching rates.

Generally, the use of photolithography and wet chemical processing for microcircuit device delineation causes semiconductor material surfaces to be exposed to many chemical processes, each with the potential to modify the electrical properties and/or chemical composition of the surface.

The use of dye laser irradiation for surface preparation of CdTe in an ultraviolet environment is presented in an article entitled "CHARACTERISTICS OF CADMIUM TELLURIDE SURFACES PREPARED BY PULSED LASER IRRADIATION", by V. Montgomery et al, Thin Solid Films, 124 (1985), pp. 11–17. Montgomery reported that CdTe surfaces subjected to treatment by bromine-methanol, which is used extensively as a polishing etch for this material, were highly contaminated with carbon and oxygen. Irradiation with a laser beam at relatively high fluences in excess of 100 mJ/cm$^2$ resulted in reducing the oxygen content to a negligible level. However, the carbon content remained excessive, even at fluences as high as 400 mJ/cm$^2$. Also, irradiation by the dye laser produced tellurium rich surfaces except under the lowest fluence conditions.

Montgomery teaches how to minimize these detrimental effects by replacing the conventional rinse with an alternative rinse procedure which was designed to reduce carbon on GaAs surfaces. Although the surface contamination was effectively removed with relatively low disruption of the underlying CdTe surface, fluence levels of 200 to 250 mJ/cm$^2$ were required, which effectively limited the beam diameter to approximately 3 mm.

Excimer lasers which operate at ultraviolet wavelengths (e.g. 308, 248, 193, 157 nm) have been advantageously employed for etching of polymer and biological materials. A typical example is found in a paper entitled "Excimer laser etching of polymide", by J. Brannon, J. Appl. Phys., 58(5), (1 Sept. 1985), pp. 2036–2043. Etching of HgCdTe using an excimer laser to convert planar waveguides into strip waveguides is reported in an article entitled "Assisted ArF excimer photo-etching of Mercury Cadmium Telluride (MCT) semiconductor", by A. Azema et al, SPIE vol 998, Excimer Beam Applications (1988), pp. 72–75. Although etching of the MCT material was accomplished, the central part of the illuminated zone exhibited extreme damage, including the formation of mercury nodules which render the material surface area unusable for fabrication of operative electronic devices therein.

SUMMARY OF THE INVENTION

The present invention provides a method and apparatus for excimer laser ablation of materials, and is especially suitable for the fabrication of electronic microcircuit devices. The present method is capable of surface layer removal of semiconductor materials such as CdTe, HgCdTe, and CdZnTe, at rates in excess of 10 Angstroms per pulse, using low fluence, pulsed excimer laser irradiation. Reproducible control and reversible changes of the surface composition are attainable as functions of laser fluence. The method has been demonstrated to possess a high degree of material selectivity for removing epitaxial layers of group CdTe from GaAs substrates, thereby facilitating the fabrication of integrated electro-optical microcircuit structures. The invention is further applicable to composition grading of semiconductor surfaces for infrared and other devices.

The present method enables the preparation of semiconductors for epitaxial deposition, and the patterning and etching of surfaces for device fabrication. The method has been demonstrated to reproducibly control the surface stoichiometry, to remove impurities from the near-surface region, and to reversibly change the surface composition.

The present invention also enables direct surface patterning using non-contact projection imaging, for the fabrication of advanced electronic and electro-optical structures such as focal plane arrays and other infrared devices. The invention combines excimer laser projection imaging, intensity profile control, and ablation, so that microstructures can be fabricated with either vertical sidewalls (large aspect ratios), or continuous sidewalls (positive or negative curvature), without the use of photolithography. The present method removes surface layers in a single step, and defines many device structures simultaneously, with resolution of less than 0.5 microns.

In accordance with the present invention, a pulsed beam from an excimer laser is used for precision ablation of cadmium telluride (CdTe) and other materials to fabricate and delineate devices in electronic microcircuit structures. The fluence of the beam may be adjusted to selectively remove one constituent of the material, such as cadmium vs. tellurium, at a higher rate than the other constituent, while maintaining the quality of the material surface. The beam may selectively remove an epitaxial layer of CdTe, CdZnTe, or HgCdTe from a GaAs substrate. The beam may be directed through a projection mask and optical system onto a material to form an image for patterned ablation. The optical system may focus an image of the mask on the material to form vertical sidewall patterns, or slightly defocus the image to form curved sidewall patterns and/or concave and convex lens structures for optical arrays.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 1 is a diagram illustrating an apparatus for practicing a laser ablation method embodying the present invention;

FIG. 2 is a sectional view illustrating a material ablated by the method of the invention;

FIGS. 9a to 9c are diagrams illustrating the formation of concave and convex lens shapes using the de-focussed projection method of the invention.

DETAILED DESCRIPTION OF THE INVENTION

Figure 3:
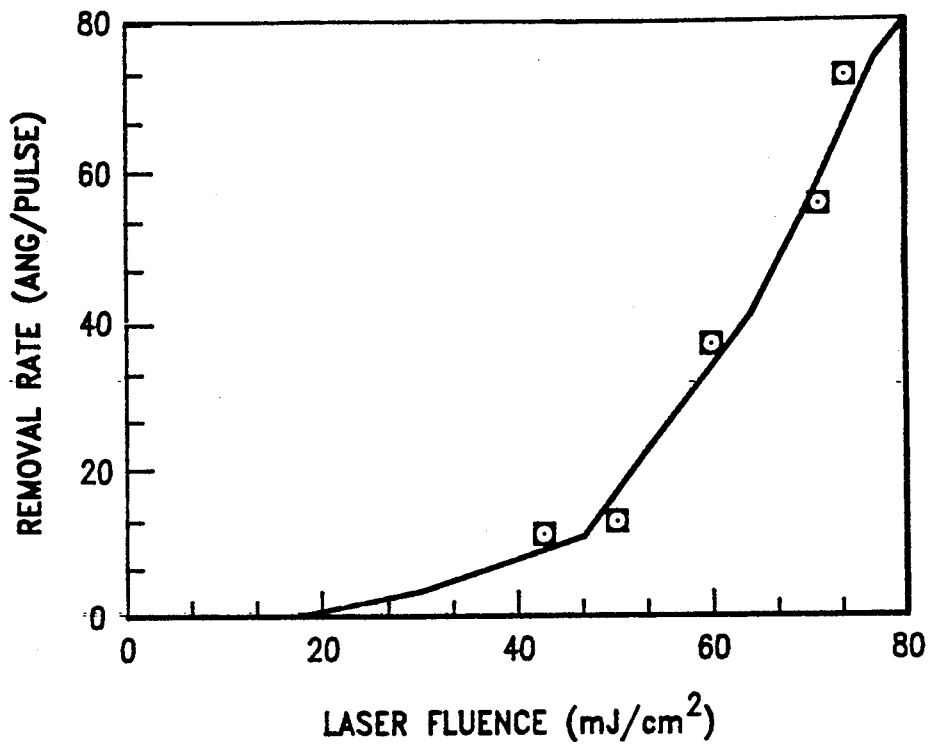
FIG. 3 is a graph illustrating a material ablation rate for cadmium telluride as a function of laser fluence for the present method.

Referring now to FIG. 1 of the drawing, a laser ablation apparatus embodying the present invention is generally designated as 10, and includes an excimer laser 12 which may typically be of the KrF or ArF type. The laser 12 generates a coherent optical beam 14 having a wavelength which is selected to be in the ultraviolet region, between approximately 157 nm or 351 nm. A material 16 which is to be patterned by laser ablation is mounted on a holder 18 such that the surface of the material 16 is preferably perpendicular to the laser beam 14. A mechanism 20, which may be manual or motorized, is provided to move the holder 18, and thereby the material 16, orthogonally as indicated by arrows 22, in a plane perpendicular to the laser beam 14 in a desired pattern. It will be noted, however, that the present invention is not limited to ablation of a flat surface, and the material 16 may have any non-planar shape as desired. Further, the mechanism 20 may be adapted to move the material in a direction parallel or at an angle to the laser beam 14.

FIG. 2 illustrates the material 16 which has been ablated by the laser beam 14 in accordance with the present invention. The material 16 preferably comprises a first component in the form of an epitaxial layer 16a of a material such as cadmium telluride (CdTe), which is a group II-VI material, deposited on a second component in the form of a layer 16b of a material such as gallium arsenide (GaAs), which is a group III-V material. The layer 16b may be a substrate. In addition to the constituents Cd and Te, the layer 16a may include a third constituent such as mercury or zinc. The combination of CdTe on GaAs is especially desirable for high speed optoelectronic applications.

Relative movement in a predetermined pattern is caused between the material 16 and the laser beam 14 so that a corresponding desired pattern is etched or ablated into the upper surface of the layer 16a as viewed in FIG. 2. The material 16 may be irradiated with the beam 14 in the form of pulses having a predetermined duration. The greater the duration and number of applied pulses, the more material is removed. As illustrated in FIG. 2, the CdTe layer 16a may be removed all the way down to the GaAs layer 16b in selected areas designated at 16c. It is further within the scope of the invention to remove only external surface portions of the layer 16a to a desired, precisely controllable depth, in selected areas designated as 16d.

Ablation of material in accordance with the present invention is primarily due to localized heating of the irradiated material caused by absorption of photons from the laser beam 14. Each pulse causes the temperature of the material in the irradiated area to be increased by an incremental amount. Irradiation by a sufficient number of pulses of sufficient fluence causes the temperature to increase above the point at which the material sublimes. When this occurs, the material in the irradiated area vaporizes, and dissipates into the ambient surroundings. Although the main mechanism for excimer laser ablation in accordance with the present invention is thermal, other mechanisms may contribute to produce the ablative effect. Excimer laser ablation has variously been described as being caused by transient vaporization, electronic excitations, hydrodynamic effects, exfoliation, etc.

The ablation process is most efficient if the irradiated material is maintained in a vacuum, although the process is operative at atmospheric pressure. Satisfactory results have been demonstrated experimentally at a pressure of approximately $10^{-3}$ Torr.

The thermal ablation process depends on matching of the laser beam wavelength with the quantum levels of the material such that incident photons of specific energy in excess of the bandgap radiation cause excitation of electrons to higher energy states. The bandgap in CdTe is 0.15 eV to 1.5 eV. A conventional excimer laser capable of producing an output energy of 5 eV has the proper wavelength and sufficient power for practicing the method of the invention with this material.

In addition, the fluence of the laser beam, or the energy per unit area, must be above an ablation fluence threshold of the material for ablation to occur. The threshold value is different for each material. As illustrated in FIG. 3, the ablation fluence threshold for CdTe for irradiation with a KrF laser beam (248 nm) is approximately 15 mJ/cm$^2$. Above this value, the rate at which material is removed by thermally induced ablation increases as a function of fluence in a non-linear manner. The present method is capable of ablating cadmium telluride surfaces using a pulsed excimer laser at a rate in excess of 10 Angstroms per pulse.

The ablation fluence threshold for GaAs is on the order of 100 mJ/cm$^2$. Therefore, irradiation of the material 16 as shown in FIG. 2 with a laser beam having a fluence between 15 and 100 mJ/cm$^2$ enables selective removal of the entire thickness of the CdTe epitaxial layer 16a as illustrated at 16c without having any significant effect on the underlying GaAs substrate layer 16b.

Figure 4:
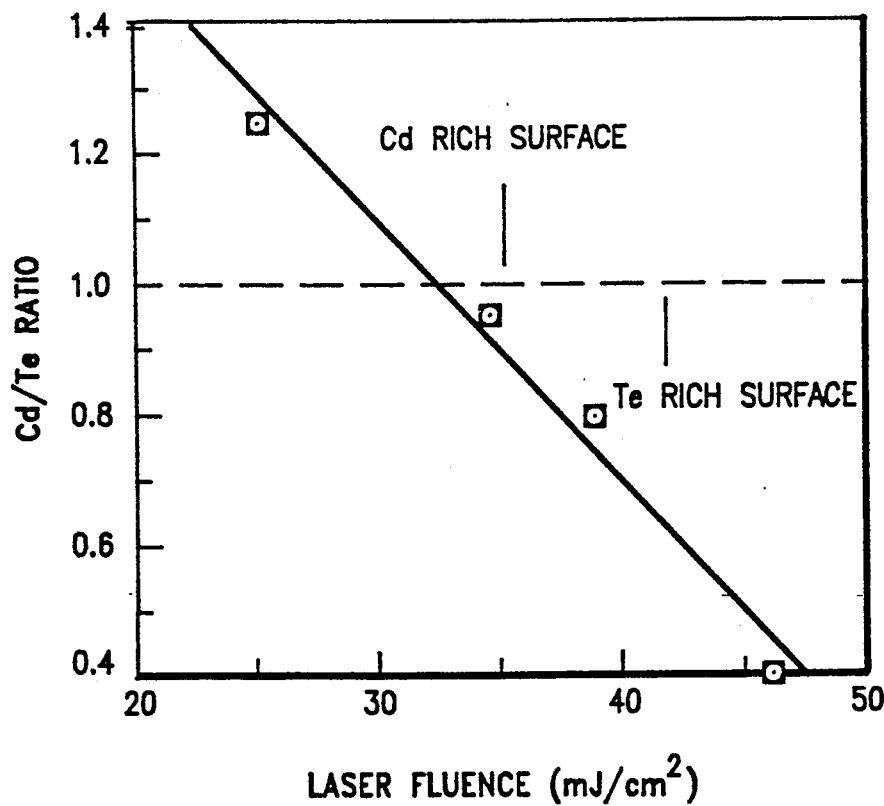
FIG. 4 is a graph illustrating the surface composition control of cadmium telluride attainable with the present ablation method.

In accordance with an important feature of the present invention, it is possible to cause the Cd and Te constituents of the component layer 16a to be ablated at different rates, while maintaining the quality of the underlying surface, and controlling the relative constituent composition or stoichiometry of the underlying surface. This is because the rate at which each constituent is ablated from the material varies as a function of irradiation fluence, and further because the functions are unequal. As illustrated in FIG. 4, the Cd/Te ratio or constituent proportion in the surface of the material 16 which remains after ablation is plotted as a function of laser beam fluence. It will be seen that, at a fluence of approximately 32 mJ/cm$^2$, equal amounts of cadmium and tellurium are ablated from the material. As the fluence is increased above 32 mJ/cm$^2$, the ablation rate for cadmium increases faster than the ablation rate for tellurium, resulting in more cadmium being removed than tellurium, and more tellurium remaining in the material after ablation. The opposite effect is true as the fluence is reduced below 32 mJ/cm$^2$. A practical range for variation of the laser beam fluence for CdTe is between 25 mJ/cm$^2$ for a cadmium rich surface, and 45 mJ/cm$^2$ for a tellurium rich surface.

Although FIG. 4 illustrates surface composition control for a two constituent material (CdTe), the method of the invention is equally applicable to a three or more constituent material such as HgCdTe or CdZnTe.

Figure 5:
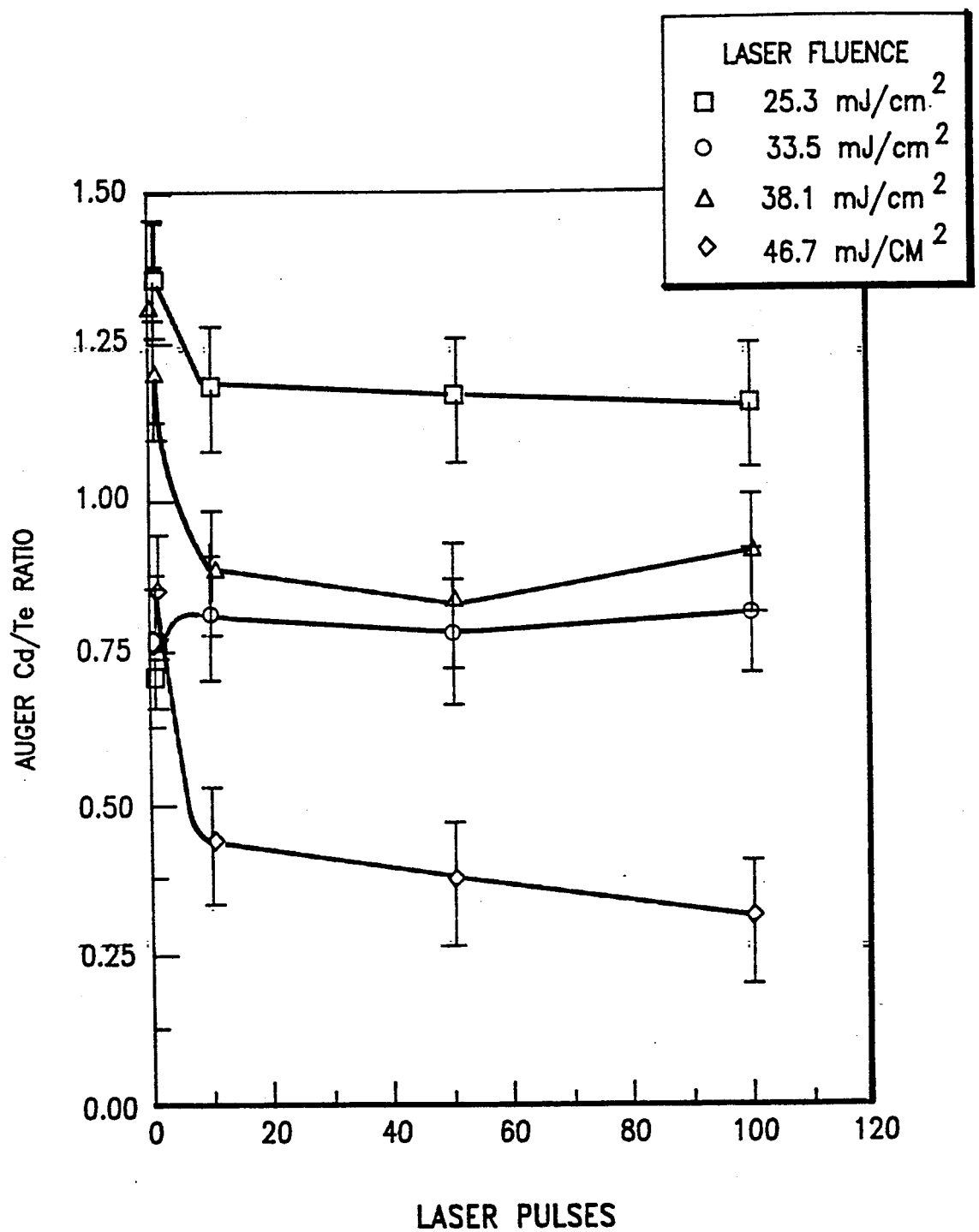
FIG. 5 is a graph illustrating the surface composition as a function of applied laser pulses for cadmium telluride obtained with the present method.

The surface stoichiometry is further dependent on the duration and number of laser pulses applied to the material. FIG. 5 illustrates experimental data obtained by Auger analysis of KrF irradiated CdTe (100) samples under varying laser beam fluence. The laser was an excimer KrF unit operating at a wavelength of 248 nm, and generating pulses with a duration of 30 ns. It will be noted that the Cd/Te ratio in the surface of the sample after ablation decreased as the number of applied pulses was increased, and generally leveled off after application of 10 pulses. The experimental results demonstrate that the amount of material removed and the surface stoichiometry are functions of the laser beam fluence, pulse duration, and number of applied pulses. The relative proportion of removed (or remaining) constituents may be selected to have any practical value, including unity and integral stoichiometric ratios.

Composition control in accordance with the present invention further enables composition grading of the material surface. A surface having a composition which is graded in a stepwise manner may be produced by irradiating a selected area with a laser beam having a first fluence, moving the material relative to the beam so that an adjacent area is irradiated with a second fluence, and so on until a desired number of adjacent areas of suitably differing composition are created.

The present invention further enables reversible control of surface stoichiometry. The CdTe material 16, for example, may be made tellurium rich by ablation using a relatively high fluence. The surface may be converted to equal proportion or cadmium rich by subsequent ablation with a relatively low fluence. It is further possible to perform rapid etching at a high fluence, and adjust the surface stoichiometry to a desired ratio by subsequent slow ablation at a low fluence.

Figures 6, 7, 8:
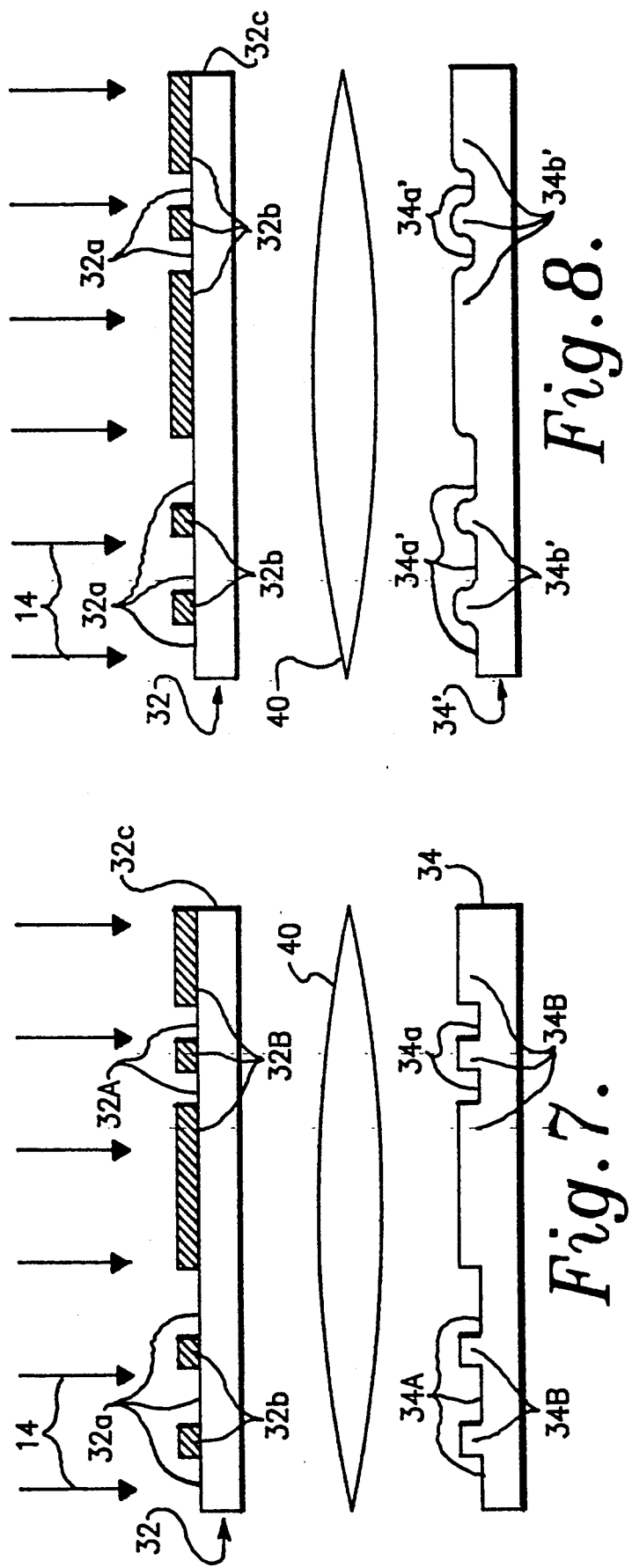
FIG. 6 is a diagram illustrating an apparatus for practicing a modified laser ablation method embodying the present invention.
FIG. 7 is a diagram illustrating patterned ablation using a focussed projection image with the apparatus of FIG. 6.
FIG. 8 is a diagram illustrating patterned ablation using a de-focussed projection image with the apparatus of FIG. 6.

The laser ablation method of the present invention may be adapted to perform patterned ablation or etching using a projection mask. As illustrated in FIG. 6, a laser ablation apparatus 30 includes the excimer laser 12 which may be the same unit used in the apparatus 10. The beam 14 produced by the laser 12 is directed through a projection mask 32 onto a material 34 which is mounted on a stationary holder 36. The beam 14 is patterned by the mask 32 to form an image of the mask on the material 16. An optional beam expander 38 may be provided to increase the cross-sectional area of the beam 14 sufficiently to illuminate the entire mask 32. Although the divergence of the beam 14 may be sufficiently low that an image of the mask 32 is formed on the material 34 without additional means, an optical element such as a converging lens 40 is preferably provided between the mask 32 and material 34 to minimize diffraction effects. The lens 40 may be selected to reduce or enlarge the image, if desired.

The material 34 may have one or more constituents. The main requirement for compatibility with the apparatus 30 is that the material 34 be capable of being ablated by irradiation with the laser beam 14.

As illustrated in FIG. 7, the mask 32 is formed with a pattern of areas 32a and 32b, having low (transparent) and high (opaque) optical densities respectively. It is further within the scope of the invention to provide the mask 32 with areas of intermediate optical density in accordance with a desired grey scale, although not shown. Typically, the opaque areas 32b are formed by printing or painting an opaque substance on a transparent carrier sheet 32c.

In the arrangement illustrated in FIG. 7, the focal length of the lens 40 and the relative spacings of the lens 40, mask 32, and material 34 are selected such that the lens 40 focuses the image of the mask 32 onto the material 34. The fluence of the beam 14 is selected such that the fluence in the areas of the image corresponding to the low density or transparent areas 32a of the mask 32 is above the ablation fluence threshold of the material 34. The laser beam fluence is further selected to be below the ablation fluence threshold of the material 34 in the areas of the image corresponding to the high density or opaque areas 32b of the mask 32. Thus, ablation occurs in areas 34a of the material 34 due to the high fluence of the laser beam irradiation transmitted through the low density areas 32a of the mask 32, while essentially no ablation occurs in low fluence areas 34b corresponding to the high density areas 32b of the mask 32.

The walls between adjacent areas 34a and 34b may be made essentially perpendicular or vertical (high aspect ratio) due to the high resolution of the apparatus 30. It has been determined experimentally that the resolution capabilities of the present projection imaging method using radiation of 157 nm or 351 nm wavelength region is less than 0.5 microns. This makes the process directly applicable to fabrication of infrared opto-electronic devices in CdTe and GaAs in which the required resolution for device delineation is on the order of 10 microns.

FIG. 8 illustrates how the apparatus 30 may be adapted to produce patterns having sloping or curved sidewalls (low aspect ratio). This is accomplished by adjusting the focal length of the lens 40, and the relative spacings of the lens 40, mask 32, and a material 34', such that the lens 40 projects an image of the mask 32 onto the material 34' which is de-focussed to a desired extent.

The de-foccusing of the image creates a continuous fluence gradient at the edges of adjacent high and low fluence areas of the image, as opposed to a sharp discontinuity in the focussed arrangement. The fluence gradient results in a continuously varying amount of ablation in the edge regions, resulting in the formation sloping, or curved edges between adjacent areas 34a' and 34b' which correspond to high and low fluence areas of the image respectively. The degree of curvature, or the aspect ratio of the edges, may be selected by adjusting the extent of de-foccusing of the image to a corresponding value.

The de-focussed projection method of patterned laser ablation in accordance with the present invention is especially advantageous for forming optical lens arrays in a substrate material. As illustrated in FIG. 9a, an exemplary projection mask 50 has an opaque area 50a and a transparent area 50b. A plurality of circular transparent areas 50c are formed in the opaque area 50a, whereas a plurality of circular opaque areas 50d are formed in the transparent area 50b. The areas 50c and 50d may be made very small and packed closely together as desired to form, for example, a focal plane optical array.

FIGS. 9b and 9c illustrate a material 52 subjected to ablation by a de-focussed image of the mask 50. The material 52 includes an area 52a corresponding to the opaque area 50a of the mask 50, which received low or no fluence, and was essentially unablated except in the image areas corresponding to the transparent areas 50c of the mask 50. The high fluence in the latter areas produced ablation in areas 52c of the material 52. The areas 52c have concave shapes, which are usable as diverging lenses in an opto-electronic array. The concave shapes are formed due to the maximum laser beam fluence in the centers of the areas 52c, and continuously decreasing fluence toward the edges of the areas 52c.

The opposite effect is produced in the area 52b, corresponding to the transparent area 50b of the mask 50, which received high fluence resulting in high ablation except in image areas corresponding to the opaque areas 50d of the mask 50. The low fluence in the latter areas produced low ablation in areas 52d of the material 52. The areas 52d have convex shapes, which are usable as converging lenses in an opto-electronic array. The convex shapes are formed due to the minimum laser beam fluence in the centers of the areas 52d, and continuously increasing fluence toward the edges of the areas 52d.

Although the lenses formed as illustrated in FIGS. 9a to 9c are circular, it is possible to form elongated two dimensional, or other non-circular optical surfaces within the scope of the invention.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A laser ablation method comprising the steps of:
   (a) providing a solid material including at least two constituents which are ablated from the material in response to laser beam irradiation of a predetermined wavelength at respective rate which vary unequally as functions of irradiation fluence;
   (b) predetermining said functions;
   (c) selecting a desired proportion between the rates at which said constituents are to be ablated;
   (d) irradiating the material with a laser beam of the predetermined wavelength;
   (e) setting the fluence of said laser beam in accordance with said functions to a level which is greater than an ablation fluence threshold of the material and which causes the constituents to be ablated from the material at rates which are in said selected proportion to each other; and
   (f) causing predetermined relative movement between the laser beam and the material such that a predetermined pattern corresponding to the predetermined relative movement is formed in a selected area of the material by ablation.

2. A method as in claim 1, in which:
   step (a) further comprises forming the solid material on a substrate which has a higher ablation fluence threshold than the constituents: and
   step (e) comprises setting said fluence as being lower than the ablation fluence threshold of the substrate.

3. A method as in claim 1, in which step (e) comprises setting said fluence such that the selected proportion is unity.

4. A method as in claim 1, in which step (e) comprises setting said fluence such that the selected proportion is stoichiometric.

5. A method as in claim 1, in which step (d) comprises irradiating the material for a duration selected in accordance with said rates such that predetermined respective amounts of the constituents are ablated from the selected area of the material.

6. A method as in claim 1, in which:
   step (d) comprises applying the irradiation in the form of a predetermined number of pulses of predetermined duration, the number and duration being selected in accordance with said rates to cause predetermined respective amounts of the constituents to be ablated from the selected area.

7. A method as in claim 1, in which step (d) comprises irradiating the selected area of the material with a laser beam having a predetermined wavelength between approximately 157 and 351 nm.

8. A method as in claim 1, in which step (a) comprises providing the material having cadmium and tellurium as the two constituents respectively.

9. A method as in claim 1, in which:
   step (a) includes providing the material having cadmium and tellurium as the two constituents respectively, with the ablation fluence threshold being approximately 15 mJ/cm$^2$; and
   step (d) includes irradiating the selected area with a laser beam having a predetermined wavelength between approximately 157 and 351 nm, and the predetermined fluence between approximately 25 and 45 mJ/cm$^2$.

10. A method as in claim 9, in which step (a) further comprises providing the material including a third constituent selected from the group consisting of mercury and zinc.

11. A laser ablation method comprising the steps of:
    (a) providing a solid material including two components in the form of separate cadmium telluride and gallium arsenide layers which have relatively low and high ablation fluence thresholds respectively in response to laser beam irradiation of a predetermined wavelength between approximately 157 and 351 nm; and
    (b) irradiating a selected area of the cadmium telluride layer having the relatively low ablation fluence threshold with a laser beam of the predetermined wavelength having a predetermined fluence between approximately 15 and 100 mJ/cm² which is between the ablation fluence thresholds of the two components, the irradiation causing removal of the cadmium telluride layer having the relatively low ablation fluence threshold form the gallium arsenide layer having the relatively high ablation fluence threshold in the selected area.

12. A laser ablation method comprising the steps of:
(a) providing a solid material including two constituents which are ablated from the material in response to laser beam irradiation of a predetermined wavelength at respective rates which vary unequally as functions of irradiation fluence;
(b) predetermining said functions;
(c) selecting a first desired proportion between the rates at which said constituents are to be ablated;
(d) irradiating a first selected area of the material with a laser beam of the predetermined wavelength;
(e) setting the fluence of said laser beam in accordance with said functions to a first level which is greater than an ablation fluence threshold of the material and which causes the constituents to be ablated from the first selected area at rates which are in said first selected proportion to each other;
(f) selecting a second desired proportion between the rates at which said constituents are to be ablated;
(g) irradiating a second selected area of the material which is adjacent to the first selected area with the laser beam of the predetermined wavelength; and
(h) setting the fluence of said laser beam in accordance with said functions to a second level which is different from the first level, greater than the ablation fluence threshold of the material, and which causes the constituents to be ablated from the second selected area at rates which are in said second selected proportion to each other.

13. A laser ablation method comprising the steps of:
(a) a providing a solid cadmium telluride material;
(b) predetermining rates at which cadmium and tellurium are ablated from the material in response to irradiation with a laser beam as functions of wavelength and fluence;
(c) selecting a desired proportion between the rates at which the cadmium and tellurium are to be ablated;
(d) irradiating a selected area of the material with a laser beam having a predetermined wavelength between approximately 157 and 351 nm; and
(e) setting the fluence of said laser beam in accordance with said functions to a level between 25 and 45 mJ/cm² and which causes cadmium and tellurium to be ablated from the selected area at rates which are in said selected proportion to each other.

14. A method as in claim 13, in which step (e) comprises setting said fluence such that the selected proportion is unity.

15. A method as in claim 13, in which step (d) comprises irradiating the material for a duration selected in accordance with said rates such that predetermined respective amounts of the constituents are ablated from the selected area.

16. A method as in claim 13, in which step (d) comprises applying the irradiation in the form of a predetermined number of pulses of predetermined duration, the number and duration being selected in accordance with said rates to cause predetermined respective amounts of the constituents to be ablated from the selected area.

17. A laser ablation method comprising the steps of:
(a) providing a projection mask having areas of high and low optical density;
(b) directing a laser beam having a predetermined fluence through the mask onto a material, thereby irradiating the material with an image of the mask to ablate portions of the material, the material having an ablation fluence threshold which is lower than a fluence of the image in an area corresponding to the low optical density area of the mask, and providing optical means between the mask and the material for de-foccusing the image of the mask onto the material for de-foccusing the image of the mask onto the material to obtain spatial ablation gradients in the material.

18. A method as in claim 17, in which step (b) comprises selecting the predetermined fluence of the laser beam such the fluence of the image in the area corresponding to the high optical density area of the mask is lower than the ablation fluence threshold of the material.

19. A method as in claim 17, in which step (b) comprises providing the material as including cadmium telluride, and the laser beam having a wavelength between 157 and 351 nm, the predetermined fluence being selected such that the fluence of the image in an area corresponding to the low optical density area of the mask is between approximately 25 and 45 mJ/cm².

20. A method as in claim 17, in which step (a) comprises providing the high optical density area of the mask as including a circular area;
the material being ablated in step (b) by irradiation with the image of the mask such that a circular convex shape is formed on an area of the material corresponding to the circular area of the image.

21. A method as in claim 17, in which step (a) comprises providing the low optical density area of the mask as including a circular area;
the material being ablated in step (b) by irradiation with the image of the mask such that a circular concave shape is formed in an area of the material corresponding to the circular area of the image.

22. A laser ablation apparatus, comprising:
a laser;
a projection mask having area of high and low optical density;
a material having a predetermined ablation fluence threshold; and
optical means provided between the mask and the material for de-foccusing the image of the mask onto the material to obtain spatial ablation gradients in the material;
the laser being disposed to direct a beam having a predetermined fluence through the mask onto the material, thereby irradiating the material with an image of the mask to ablate portions of the material, a fluence of the image in an area corresponding to the low optical density area of the mask being higher than the ablation fluence threshold of the material.

23. An apparatus as in claim 22, in which the predetermined fluence of the laser beam is selected such that the fluence of the image in the area corresponding to the high optical density area of the mask is lower than the ablation fluence threshold of the material.

24. An apparatus as in claim 22, in which the material comprises cadmium telluride, the laser beam having a wavelength between 157 and 351 nm, the predetermined fluence being selected such that the fluence of the image in an area corresponding to the low optical density area of the mask is between approximately 25 and 45 mJ/cm$^2$.

25. An apparatus as in claim 22, in which the optical means comprises a converging lens.

26. An apparatus as in claim 22, in which the high optical density area of the mask comprises a circular area;

the material being ablated by irradiation with the image of the mask such that a circular convex shape is formed on an area of the material corresponding to the circular area of the image.

27. An apparatus as in claim 22, in which the low optical density area of the mask comprises a circular area;

the material being ablated by irradiation with the image of the mask such that a circular concave shape is formed in an area of the material corresponding to the circular area of the image.

* * * * *